United States Patent [19]

Brusaw

[11] Patent Number: 5,124,795
[45] Date of Patent: Jun. 23, 1992

[54] TIER SELECTION CONTROL FOR A TELEVISION SET

[75] Inventor: Scott D. Brusaw, West Carrollton, Ohio

[73] Assignee: Precision Industries Incorporated, Springboro, Ohio

[21] Appl. No.: 652,552

[22] Filed: Feb. 8, 1991

[51] Int. Cl.[5] .......................... H04N 5/50; H04N 7/16
[52] U.S. Cl. ................. 358/191.1; 455/186.1
[58] Field of Search ................. 358/191.1, 194.1; 455/186; 380/20, 10

[56] References Cited

U.S. PATENT DOCUMENTS

| | | | |
|---|---|---|---|
| 4,158,816 | 6/1979 | Wine . | |
| 4,279,035 | 7/1981 | Skerios | 455/158 |
| 4,280,140 | 7/1981 | Skerios | 358/195.1 |
| 4,375,651 | 3/1983 | Templin et al. | 358/191.1 |
| 4,510,623 | 4/1985 | Bonneau et al. | 455/181 |
| 4,696,034 | 9/1987 | Wiedemer | 380/16 |
| 4,760,597 | 7/1988 | Hayes | 380/10 |
| 4,768,229 | 8/1988 | Benjamin et al. | 380/20 |
| 4,792,972 | 12/1988 | Cook | 380/20 |
| 4,807,286 | 2/1989 | Wiedemer | 380/16 |
| 4,908,834 | 3/1990 | Wiedemer | 380/5 |
| 5,065,235 | 11/1991 | Iijima | 455/186 X |

Primary Examiner—James J. Groody
Assistant Examiner—Mark R. Powell
Attorney, Agent, or Firm—Roger S. Dybvig

[57] ABSTRACT

A cable-ready television set having a controller with first and second sets of leads for scanning a plurality of push-button switches and, in response to actuation of the switches, entering into a tuner memory designations defining which channels may be selected for viewing and which channels may not be selected, is modified by disconnecting the switches and connecting the first and second sets of leads to a first connector accessible from the exterior of the set. A hand-held programming module includes a plurality of programming switches connected to a second connector so that each programming switch is connected between one lead in each of the first and second sets of leads when the connectors are mated. The hand-held module includes a non-volatile memory for storing tier data and a microprocessor responsive to actuation of tier selection switches on the module for applying the tier data to the programming switches. Actuation of the programming switches causes the tuner controller to load the tuner memory with designations indicating which channels may or may not be viewed.

10 Claims, 4 Drawing Sheets

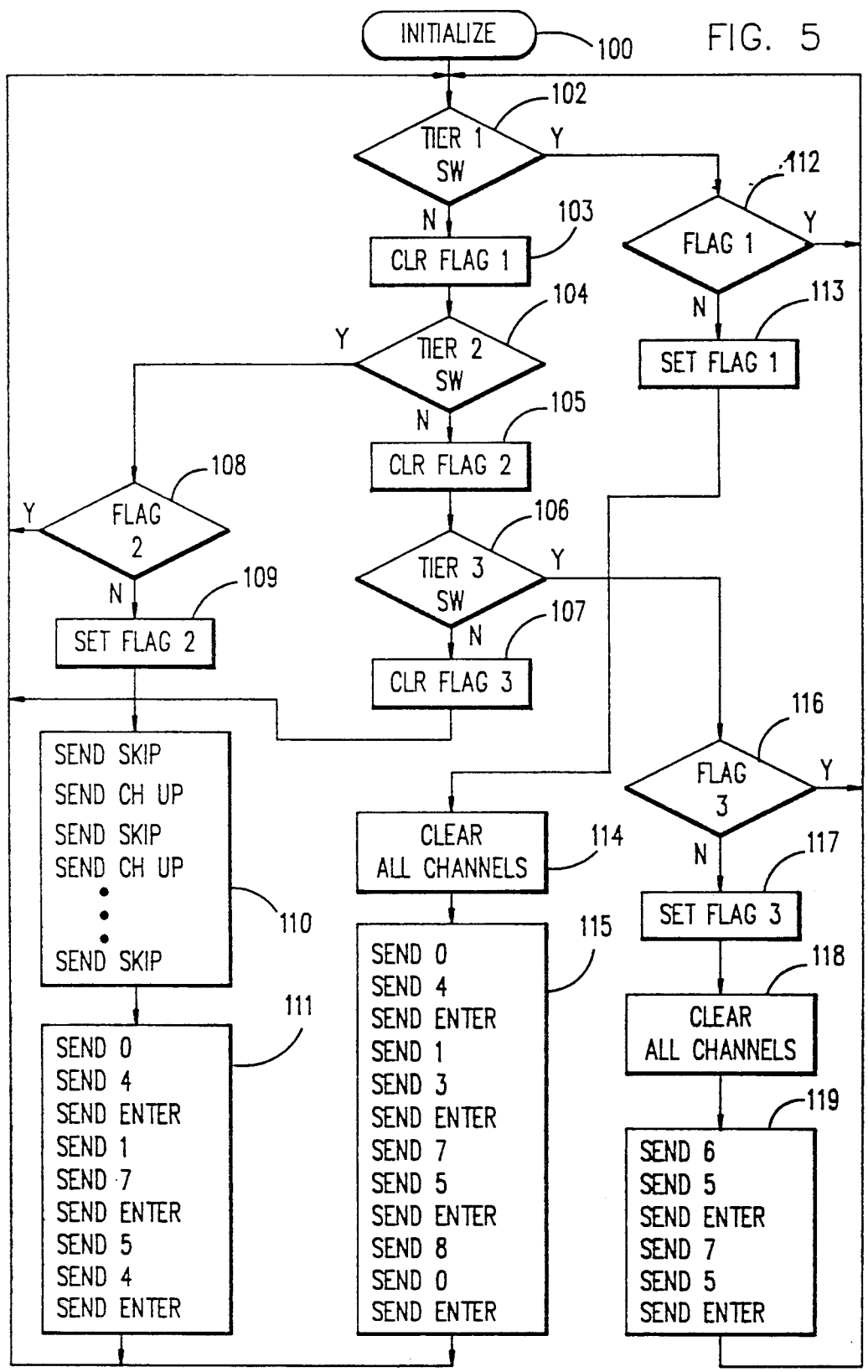

TIER SELECTION CONTROL FOR A TELEVISION SET

FIELD OF THE INVENTION

The present invention relates to tier selection for television receivers generally made available to the public for a fee depending on the tier or group of channels the viewer wishes to have available for viewing. More particularly, the present invention provides a system wherein the tuning memory within a television receiver is controlled by a hand-held module which may be plugged into the receiver so that the tuning memory may store indications of the channels in a selected tier.

BACKGROUND OF THE INVENTION

Various systems have been employed to control viewing access on television receivers provided in public accommodations such as hospital and hotel rooms so that fees may be collected based on the programming made available to the viewer. These systems have variously included scrambling of the television signal and the use of credit cards or tokens. Benjamin et al U.S. Pat. No. 4,768,229 and Templin et al. U.S. Pat. No. 4,375,651 disclose the use of keys which must be inserted into a lock provided on the side of a television set, the key permitting entry of programming information into a tuner memory via a push-button panel on the set. These systems permit entry of information regarding a program tier but require actuation of push-buttons to enter each channel number individually. Furthermore, the security of this system may be defeated by slight modification of the leads to the switch controlled by the key.

U.S. Pat. No. 4,792,972 to Cook discloses a hand-held module for programming tier data into the memory of a CATV channel authorization unit from a remote module, the channel authorization unit then limiting the channels which may be viewed on an associated television receiver. A disadvantage of this system is that it requires a separate authorization unit for each television receiver and permits control of only CATV channel access.

SUMMARY OF THE INVENTION

An object of the present invention is to provide a method and system for limiting channel access on a television receiver, the system being such that it cannot be defeated by the viewer.

An object of the present invention is to provide a system for entering programming data directly into the tuner memory of a television receiver from a portable unit which may be sequentially associated with a plurality of sets, the portable unit deriving its power from the set with which it is associated.

A further object of the invention is to provide a hand-held module which may be plugged into a television receiver, the module controlling the entry of the numbers of all the channels comprising a tier in response to actuation of a single push-button switch.

Another object of the invention is to provide a hand-held module as described above wherein the module includes a read only memory having stored therein the channel numbers of channels comprising a plurality of tiers, the module having a push-button thereon corresponding to each of the tiers.

In accordance with the principles of the present invention a hand-held unit includes a microprocessor, a plurality of push buttons and a read only memory. The memory stores the numbers of the channels which comprise a tier of channels to which a viewer may have access. The memory may store the channel data relating to a plurality of tiers. The module is plugged into a television receiver having a tuner memory and derives its power from the receiver. Certain programming and channel selection push buttons on the television receiver are disconnected, and when the module is plugged into the receiver, switches in the module serve the same function as the disconnected push-buttons. When a push button on the module is actuated the microprocessor sequentially reads out of the module memory signals representing the channel numbers of the channels comprising a programming tier and actuates the switches in accordance with the signals read from the module memory to thereby enter the tier data into the tuning memory of the television receiver.

Other objects of the invention and its mode of operation will become apparent upon consideration of the following description and the accompanying drawings.

BRIEF DESCRIPTION OF THE DRAWINGS

FIG. 3 shows switches which are actuated by the outputs of the latches of FIG. 2, and the connector by means of which the module is connected to a television receiver;

DETAILED DESCRIPTION OF THE INVENTION

Figure 1:
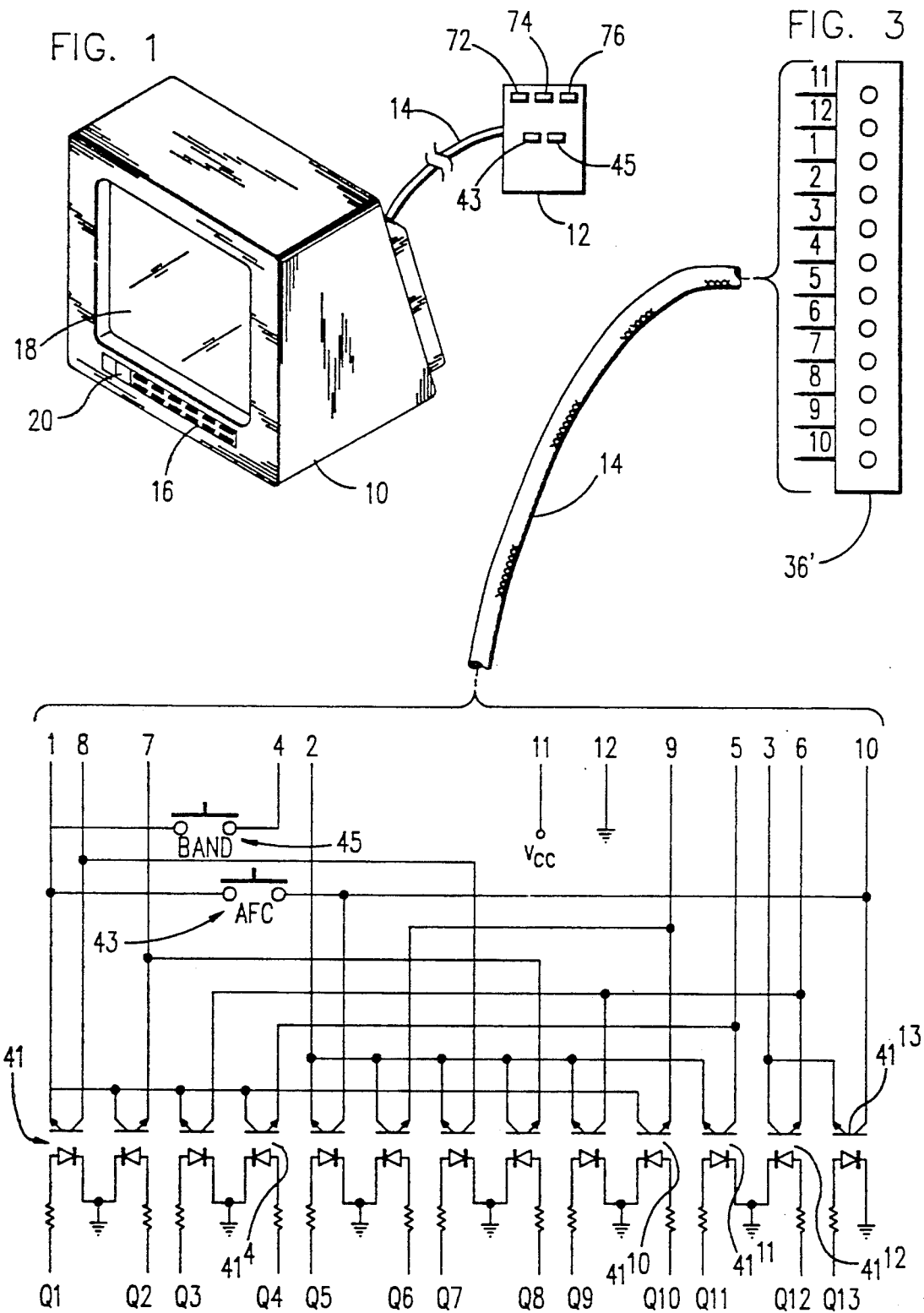
FIG. 1 shows a television receiver with a hand-held programming module attached thereto.

FIG. 1 illustrates a television set or receiver 10 and a portable hand-held tier programming module 12 connected to the back of the receiver by a cable 14. The receiver 10 includes a push-button panel 16 for controlling sound volume, selecting a channel to be displayed on a screen 18 and programming a tuner memory in the receiver. The receiver also includes an LED display 20 for displaying the number of the selected channel or data regarding the state of a programming operation. The television set 10 may be a Zenith model F0920A or other conventional cable-ready set which is slightly modified as subsequently described.

Figure 4:
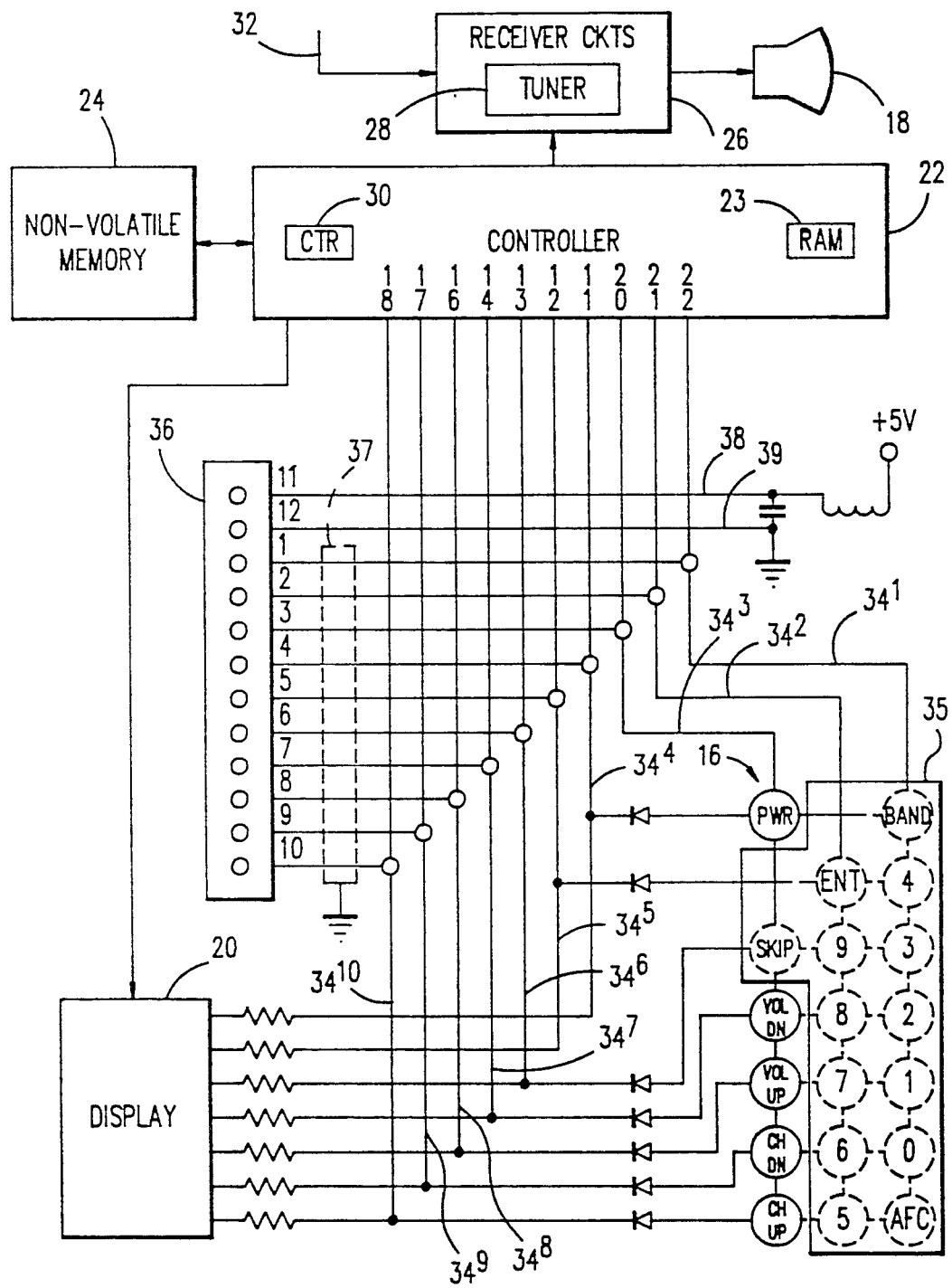
FIG. 4 is a schematic diagram of a television receiver modified in accordance with the principles of the present invention; and, FIG. 5 is a flow diagram illustrating the sequence of operation of the microprocessor of FIG. 1.

FIG. 4 schematically illustrates a circuit within the television receiver 10. These circuits are conventional and their functions are hereinafter described only to the extent necessary to gain an understanding of the present invention. The circuits comprise a controller 22, a non-volatile memory 24 and receiver circuits 26 including a tuner 28. The controller includes a microprocessor and a random access memory (RAM) 23. The program executed by the controller is stored in the non-volatile memory 24 so that it is not lost when power is turned off. The memory 24 also stores, at consecutive addresses, the channel number, and tuning voltage information for consecutively numbered channels. This information is entered into memory 24 by the manufacturer. However, the memory contents may be electrically modified. When the receiver is turned on, the controller 22 brings the stored data into RAM 23. Programming information entered into RAM 23 while the receiver is on is also saved in memory 24 when the receiver is turned off.

The controller includes an address counter 30 whose contents may be used to develop an address for addressing memory 23 to read out a channel number, a saved/-skipped status indicator for the channel and the associated tuning information. The channel number is applied to the LED display 20 while the tuning information controls an oscillator associated with tuner 28 so that a VHF, UHF or CATV signal applied to the receiver circuits 26 from an antenna input 32 may be displayed on screen 18. The saved/skipped designator either permits selection of a channel for viewing (saved) or blocks its selection (skipped).

The controller 22 repeatedly scans the switches associated with the push-buttons on panel 16 and performs programming functions or channel selections depending upon which switch or switches is/are actuated. The controller has three output leads $34^1$, $34^2$ and $34^3$, each of which is connected to one terminal of each switch in a vertical row of switches and seven input leads $34^4$-$34^{10}$ each of which is connected to a terminal of each switch in a horizontal row. The controller accomplishes switch scanning by sequentially applying signals to the vertical rows of switches over leads $34^1$-$34^3$ and sensing the resulting signals on leads $34^4$-$34^{10}$. For example, if the controller applies a signal over lead $34^1$ and senses a resulting signal on lead $34^6$ it is an indication that the push-button for the digit "3" is depressed. On the other hand, if the controller applies a signal over lead $34^2$ or $34^3$ and senses a return signal on lead $34^6$ it is an indication that the "9" or the SKIP push-button, respectively, is depressed.

U.S. Pat. Nos. 4,279,035, 4,280,140 and 4,158,816, the disclosures of which are incorporated herein by reference, disclose the functions of the switches and the manner in which they are scanned. Briefly, the functions of the switches are as follows.

| | |
|---|---|
| PWR | Power on/off switch. |
| VOL UP | Increases sound volume. |
| VOL DN | Decreases sound volume. |
| BAND | Selects band of frequencies which may be viewed, i.e. UHF/VHF/CATV etc. |
| AFC | When active causes fine tuning of a selected channel transmitted at a frequency offset from the FCC-designated standard frequency. |
| CH UP | Each actuation causes the count in counter 30 to be incremented so that successive "saved" channels may be selected for viewing. |
| CH DN | Like CH UP but decrements counter 30. |
| 0–9 | For entering the digits of the number of a channel which is to be viewed. Entry of one or more digits must be followed by actuation of ENTER push-button to effect selection of the channel. |
| ENT | Causes the channel number selected by switches 0–9 in the counter 30 to select a channel for viewing. |
| SKIP | Affects the channel presently selected for viewing. At first depression of the SKIP button sets a "skip" designator in memory 23 so that the channel can't be selected for viewing. A second depression changes the designator in memory 23 so that the channel may again be selected for viewing. |

In accordance with the present invention, the BAND, ENTER, AFC, SKIP and 0–9 push-button switches are electrically disconnected and their push-buttons are covered with a plate 35 so that they are no longer visible. A female connector 36 is mounted so as to be accessible from the rear of the television receiver 10 and the leads in a grounded cable 37 are connected at one end to pins of the connector. The other ends of these leads are soldered to terminals on the switch pad for the push-button switches 16. The television receiver is further modified by connecting pins 11 and 12 of the connector 36 to +5V and ground in the receiver, these connections being made by leads 38 and 39, respectively.

The connector 36 is adapted to mate with a male connector $36^1$ (FIG. 3). The hand-held module 12 has within it 13 electro-optical switches 41. The terminals of these switches are connected via leads in cable 14 to the connector $36^1$. When a nurse, bellhop or other attendant plugs the connector $36^1$ into connector 36, the switches 41 effectively replace the push-button switches 16 which have been disconnected in the receiver 10. For example, the electro-optical switch $41^1$ replaces the digit "1" switch. The terminals of switch $41^1$ are connected via leads 1 and 8 in cable 14 to pins 1 and 8 of the connector $36^1$. When the connector $36^1$ is plugged into connector 36 leads 1 and 8 in cable 14 are connected to the scanning leads $34^1$ and $34^8$. It will be noted that these are the two leads which are utilized in determining whether or not the "1" push-button has been depressed. Thus, the controller 22 may scan the switches 41 in the same manner as it scans the push-button switches 16.

It should be noted that the electro-optical switch $41^{13}$ is connected in parallel with the CH UP push-button which has not been disconnected. This permits the counter 30 to be incremented for channel selection by either the viewer or the programming module 12.

The programming module 12 is provided with two manually actuated switches 43 and 45 (FIG. 3) which replace, and are scanned in place of, the disconnected BAND and AFC push-button switches 16.

FIG. 1 illustrates circuits within the programming module 12. These circuits include a microprocessor 40, a memory 42, a decoder 44, a plurality of latches 46 and 48, a plurality of drivers 50, and three tier selection switches 72, 74 and 76.

Microprocessor 40 may be a type 6802 microprocessor driven by a 4 Mc crystal oscillator 52. The microprocessor has eight data input/output terminals connected by a bi-directional data bus 54 to the inputs of latches 46 and 48 and the outputs of drivers 50 and memory 42. The microprocessor produces 16-bit addresses on an address bus 56. Bit positions A10-A0 are connected to the address inputs of memory 42 which may be a type 2716 EPROM memory. Bit positions A15-A12 are connected to the decoder 44 whose outputs selectively enable memory 42, latches 46 or 48, or drivers 50 depending upon the signals A15-A12 applied to its input.

The microprocessor 40 produces a $\phi2$ clock signal E and this signal is applied to one input of a NAND 58. The microprocessor also generates the signal VMA when it places a valid memory address on address bus 56 and the VMA signal is applied to a second input of NAND 58. The output signal from NAND 58 is inverted by a NAND 59 and applied to the Output Enable (/OE) of memory 42.

Although decoder 44 is a 4-to-16 decoder, only four of its outputs are utilized. When the value of A15-A12 is 15, the decoder produces an output signal on a lead 60 which is connected to the Chip Enable (/CE) input of memory 42. The memory stores the program which is executed by microprocessor 40. Since three tier switches are shown, the EPROM memory 42 also stores three sets of channel numbers, each set comprising one tier. The memory 42 is a pluggable unit hence it may be removed and returned to a manufacturer for reprogramming with different tier data. This may be necessary if the CATV provider should discontinue or add a new channel, or if the hospital or hotel should decide to change the particular channels which will be made available in a given tier.

When the value of bits A15-A12 is six or seven, the decoder 44 produces an output signal on a lead 62 or a lead 64, respectively. These signals are inverted by NANDs 66 and 68, respectively, and are applied to the Enable (/EN) inputs of latches 46 and 48, respectively. The latches may be 74HCT373 latches which latch in the data present on bus 54 when the signal at the /EN input goes low and gate the latched data to the Q outputs when the signal at the /EN input goes high. The outputs of latches 46 and 48 are connected to the electro-optical switches 41 shown in FIG. 3.

When the value of bits A15-A12 is two, decoder 44 produces an output signal over a lead 70 to enable drivers 50. The drivers 50 may comprise a type 74HCT244 octal driver chip having five unused drivers with inputs tied to $V_{cc}$. The other three drivers have inputs connected to ground through tier selection switches 72, 74 and 76 for selection of tier 1, tier 2 and tier 3, respectively. Although only three switches are shown, it will be obvious that more or fewer switches may be provided depending upon how many different tiers are to be available for programming selection.

An attendant may use the programming module 12 in the following manner to program the television receiver 10 so that a viewer may subsequently view a CATV channel he selects from a tier of channels determined by the attendant. The attendant actuates the power push-button switch on the panel 16 and the plugs the connector 36[1] into the connector 36. The controller 22 begins scanning the electro-optical switches 41 by sending out scanning signals on leads 34[1]-34[3] and sensing the signals on leads 34[3]-34[10].

Figure 2:
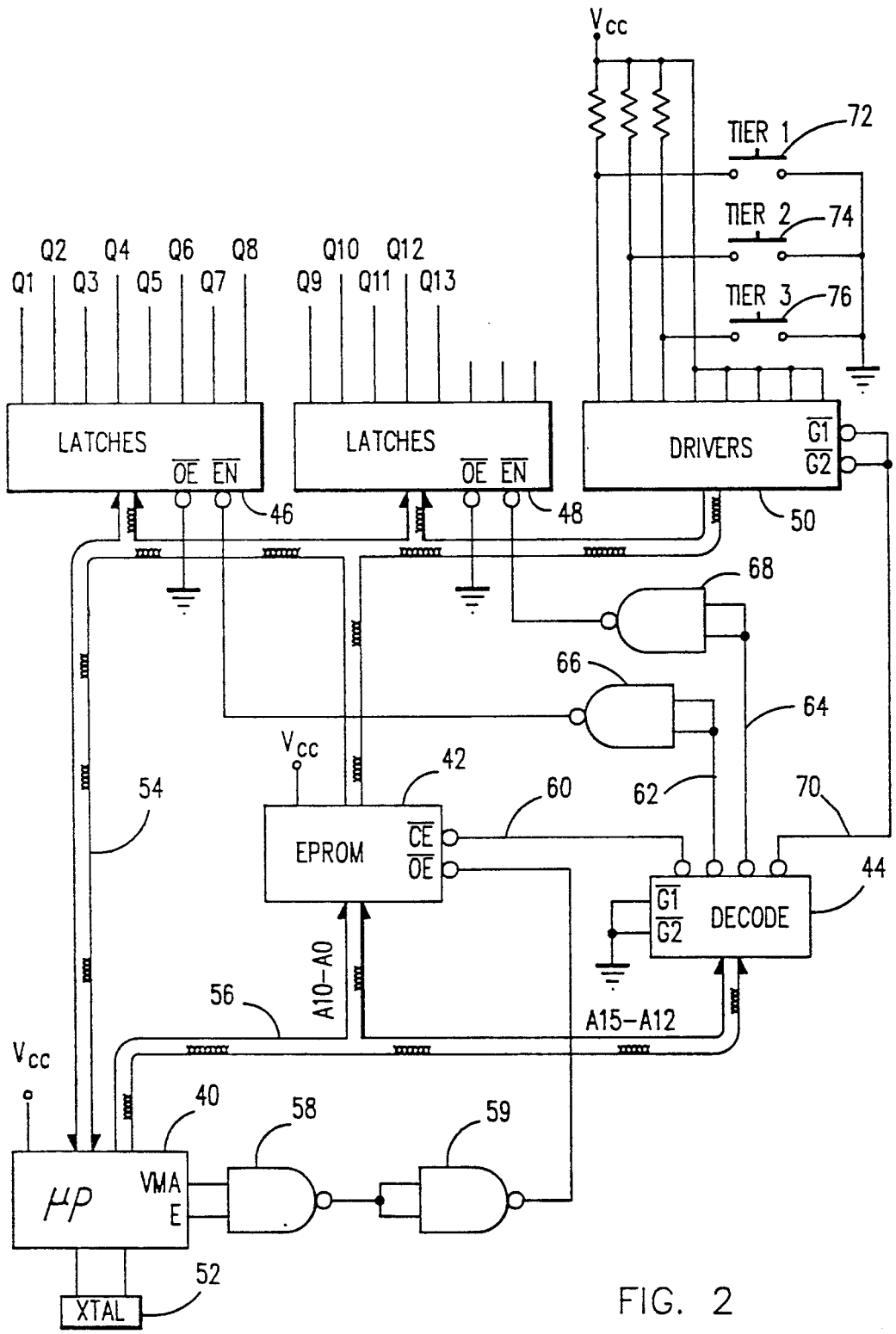
FIG. 2 shows the microprocessor, memory and latches contained within the programming module.

When the connectors 36 and 36[1] are mated the +5V and ground in receiver 10 pass through the connectors and are available on leads 11 and 12 (FIG. 3) in the programming module. These signals are distributed to the various elements of FIG. 2 as shown. When the microprocessor 40 receives the voltage $V_{cc}$ it executes a power-up reset and begins execution of a program as illustrated in FIG. 5. The microprocessor 40 first initializes various registers and counters at step 100. The microprocessor then repeatedly senses the outputs of drivers 50 and analyzes the outputs to determine if one of the tier selection switches 72, 74 or 76 is actuated. At step 102 a check is made to see if the tier 1 switch 72 is actuated. If it is not, the program proceeds to clear an indicator FLAG 1 at step 103. At step 104 a determination is made as to whether the tier 2 switch 74 is actuated. If it is not then step 105 clears FLAG 2. At step 106 the tier 3 switch 76 is tested and if it is not set FLAG 3 is cleared at step 107. The program then returns to step 102. Steps 102-107 are repeatedly executed by the microprocessor 40 until one of the tier selection switches is actuated.

After the programming module has been plugged into the television receiver, the attendant actuates the band switch 45 (FIG. 3). If the receiver 10 is connected to a cable system, the BAND push-button is depressed until a C (for cable) appears on the display 20. If the receiver 10 is not connected to a cable system then the BAND push-button is depressed until a "B" (for broadcast) appears on display 20. Next, the attendant depresses the AFC push-button 43 until an "F" appears on display 20. The attendant then releases the push-button and waits until the channel display reappears. The television receiver is now ready for receiving CATV programming data. It should be noted that the BAND and AFC push-buttons need be utilized only for the initial receiver installation when it is being set up for cable operation. Once set, the BAND and AFC push-buttons 43 and 45 will not be used again until a change is made from cable to the broadcast band or vice versa.

The operation of the AFC and band switches in no way affects the operation of the microprocessor 40 in the module 12 and it continues to sample the tier selection switches 72, 74 and 76 until one of the switches is actuated. For purposes of the following discussion, it is assumed that EPROM 42 contains data providing the following channel selections for the different tiers.

| Tier 1 | Tier 2 | Tier 3 |
|---|---|---|
| 4 | 4 | 65 |
| 13 | 17 | 75 |
| 75 | 54 | |
| 80 | | |

It will be understood that any tier may include more or fewer channels depending upon what range or ranges of selection are to be provided.

Assume that the operator depresses the tier 2 selection switch 74. When the microprocessor program reaches step 104 it senses that the switch is actuated and branches to step 108 where it tests FLAG 2. The purpose of FLAG 2 is to prevent more than one response to a single actuation of the tier 2 switch. If the test at step 108 shows that flag 2 is not set then the flag is set at step 109 and the program proceeds to step 110.

The purpose of step 110 is to render all channels inactive by storing in the tuner memory (RAM 23) an indicator designating them as "skipped" channels. The microprocessor alternately sends SKIP and CH UP signals to controller 22, with the number of skip signals being equal to the number of channels available. The microprocessor 40 sends a SKIP signal by applying to latches 48 a value which generates the signal Q12. In FIG. 3, the signal Q12 turns on the LED of electro-optical switch 41[12] so that a conductive path is established between the scanning leads 34[3] and 34[6]. When controller 22 next generates a scan signal on lead 34[3], the return signal on lead 34[6] causes controller 22 to address RAM 23 and store therein a "skip" designation at the location assigned in the memory for the channel whose number is present in counter 30.

After the first SKIP signal is sent to the controller 22, the microprocessor 40 applies to latches 48 a value for generating the signal Q13. In FIG. 3, the signal Q13 turns on switch 41[13] so that a conductive path is established between the scan lines 34[3] and 34[10]. This simulates operation of the CH UP button on panel 16. When the controller 22 next generates a scan signal on lead 34[3], the return signal on lead 34[10] causes controller 22 to increment the count in counter 30. The microprocessor 40 then sets latches 48 to again generate signal Q12 so that another SKIP signal is sent to the controller, and after the SKIP signal is sent the microprocessor again sets latches 48 so that the signal Q13 is again generated to send another CH UP signal to the controller. The SKIP and CH UP signals are thus alternately sent to the controller until all the memory locations in RAM 23 for storing the "saved" or "skipped" status are set to designate the skipped status.

The counter 30 need not be set to any particular channel number before the first skip is sent by the programming module. Counter 30 counts up to a value representing the maximum number of channels and, when the next CH UP signal is received, it returns to a count of $\phi1$.

Although not shown in the sequence diagram of FIG. 5, the microprocessor 40 executes a wait of about 40ms after sending each signal to controller 22. The reason for this is that the microprocessor 40 and controller 22 are not synchronized. Therefore, after a signal is sent to controller 22 the microprocessor 40 must wait for an interval of time sufficient for the controller to execute any routine which it must carry in response to the signal.

Once all of the channels have been designated "skipped" by execution of step 110, the microprocessor is ready to transfer to controller 22 the data which will enable a viewer to select for viewing any one of the channels included in tier 2. This is accomplished at step 111.

As previously noted, the EPROM 42 stores at sequential locations the data which must be transferred to controller 22 in order to enable a viewer to select for viewing any one of the channels included within tier 2. The microprocessor 40 first accesses memory 42 and reads therefrom the first digit of the number of the first channel in tier 2. In the assumed example, the channel number is 4 hence the value read from memory 42 simulates actuation of the zero push-button. When the value is read from memory 42 it is applied to latches 48 so that the latches generate the signal Q10. In FIG. 3, the signal Q10 turns on switch $41^{10}$ so that a conductive path is formed between scan lines $34^1$ and $34^9$. When controller 22 next issues a scan signal on lead $34^1$ the return signal on lead $34^9$ causes a zero to be entered as the first digit in counter 30.

Microprocessor 40 then accesses the next sequential address in memory 42 and reads out a value which is applied to latches 46 so that the latches generate the signal Q4. In FIG. 3, the signal Q4 enables switch $41^4$ so that a conductive path is formed between scan lines $34^1$ and $34^5$. When the controller 22 next issues a scan signal on lead $34^1$, the return signal on lead $34^5$ causes the controller to enter into counter 30 the digit 4. The counter 30 at this point contains the channel number 04.

Microprocessor 40 again accesses memory 42 and reads out to latches 48 a value for causing the latches to produce the signal Q11. In FIG. 3, the signal Q11 turns on switch $41^{11}$ so that a conductive path is formed between scan lines $34^2$ and $34^5$. This simulates operation of the disconnected ENTER push-button. When the controller 22 next issues a scan signal on lead $34^2$, the return signal on lead $34^5$ causes the controller 22 to use the contents of counter 30 to access RAM 23 and store therein a designation that channel $\phi4$ has a "saved" status. After channel 4 has been assigned a saved status, the microprocessor 40 then reads from memory 42 the values necessary to send the digits 1 and 7 to counter 30 followed by another signal simulating actuation of the ENTER push-button. The manner in which is this accomplished is believed obvious from the foregoing description. After channel 17 has been assigned a saved status the microprocessor 40 then sends signals representing digits 5 and 4 to controller 22 followed by still another ENTER signal. This assigns saved status to channel 54 in RAM 23.

The entry of the tier 2 data is complete when the last instruction in step 111 is executed. The connectors 36-36$^1$ may be separated anytime after the display 20 displays a channel number. During execution of step 111 the controller 22 causes display to display the symbols "PO" and once the controller has stored the saved status for the last channel of the tier it displays the channel number.

After step 111 is completed, the microprocessor returns to step 102. Assuming the attendant is still depressing the tier 2 push-button 74 the microprocessor executes steps 103 and 104, and since the push-button 74 is still depressed, the program branches to step 108. Since FLAG 2 is still set the program branches back to step 102 and repeats steps 102, 103, 104 and 108 until the push-button 74 is released. When it is released, the next execution of step 104 detects the release and the program moves to step 105 where FLAG 2 is cleared. The microprocessor 40 then repeats the loop comprising steps 102-107 until the connectors 36-36$^1$ are separated or until a tier selection push-button 72, 74 or 76 is actuated.

Entry of tier 1 or tier 3 data in response to actuation of the push-buttons switch 72 or 76, respectively, is accomplished in essentially the same manner as entry of tier 2 data and thus should be obvious from the flow diagram of FIG. 5. If the tier 1 switch is actuated, the program detects this at step 102 and sets FLAG 1 at step 113. All channels are designated "skipped" at step 114 which is identical to step 110. Step 115 then enters a "saved" designation into RAM 23 for each of the channels in tier 1.

In like manner, if the tier 3 switch is actuated, the program detects this at step 106 and sets FLAG 3 at step 117. Step 118 causes all channels to be designated as "skipped" in RAM 23 and step 119 then enters into the RAM a "saved" designation for each of the channels included in tier 3.

Once the tier data has been entered into receiver 10 and the attendant has disconnected the programming module from the receiver, the CH UP and CH DN push-buttons on panel 16 are the only means of selecting a channel for viewing. As a viewer repeatedly depresses one of these push-buttons the receiver will selectively display on screen 18 only those channels which have had a "saved" status stored in RAM 23 as a result of microprocessor 40 executing one of the programming steps 111, 115 or 119.

From the foregoing description it is seen that the present invention provides a secure tier programming system which prevents viewing of selected channels without prior authorization. Both broadcast and CATV channel viewing may be restricted. The programming module is simple to operate and does not require manual entry of each specific channel number. Furthermore, the EPROM memory in the programming module may be easily replaced to add or delete channels in a tier.

While a preferred embodiment of the invention has been described in specific detail, it will be understood that various modification and substitutions may be made in the described embodiment without departing from the spirit and scope of the invention as defined by the appended claims. For example, the program of FIG. 5 shows a leading zero transmitted for channels having single digit channel numbers. In some television receivers it is not necessary to enter such a leading zero.

The embodiments of the invention in which an exclusive property or privilege is claimed are defined as follows 1. A programming system for limiting access to channels which may be viewed on a television receiver, said television receiver having therein a tuner controller, a tuner memory and first and second sets of leads, the tuner controller producing output signals on said first set of leads for scanning programming switches and having inputs connected to said second set of leads and responsive to scanning signals passing through said switches for accessing said tuner memory, said first and second sets of leads being connected to a first connector accessible from the exterior of said television receiver; a programming module having therein a microprocessor, a non-volatile memory for storing tier data, and a plurality of programming switches, said programming module having thereon a plurality of tier selection switches, said microprocessor being responsive to actuation of one of said tier selection switches for sequentially accessing said non-volatile memory and reading therefrom tier data for selectively actuating said programming switches to transmit channel numbers to said controller; and cable means connected to said programming switches and terminating at a second connector matable with said first connector whereby each of said programming switches is connected between a lead of said first set and a lead of said second set when said connectors are mated.

2. A programming system as claimed in claim 1 wherein a voltage source is connected to a pin of said first connector and said microprocessor is connected to a lead which terminates at a corresponding pin of said second connector whereby power for operating said microprocessor is derived from said television receiver.

3. A programming system as claimed in claim 1 wherein said tier data comprises a tier of data corresponding to each tier selection switch, each of said tiers of data defining the channel numbers of channels to which viewer access is permitted.

4. A programming system as claimed in claim 1 wherein, following actuation of said programming switches to transmit a channel number, the microprocessor actuates one of said switches to transmit a Channel Up signal to said controller, said controller being responsive to a channel number and a Channel Up signal for entering into said tuner memory a "saved" status.

5. A programming system as claimed in claim 1 wherein said microprocessor, in response to actuation of one of said tier selection switches, energizes said programming switches to alternately transmit Skip and Channel Up signals to said controller.

6. The combination comprising:
a tuner controller;
a television receiver including,
a tuner memory for storing saved and skipped designations of channels which may be viewed and may not be viewed;
a first connector connected to said controller through which channel number signals and Enter signals may be applied to said tuner controller;
said controller being responsive to said channel number signals and said Enter signals for accessing said tuner memory to store therein a saved designation for those channels whose channel numbers are applied to said controller; and,
a hand-held programming module having a second connector mating with said first connector, said programming module having therein means for applying channel number signals and Enter signals to said tuner controller in response to scan signals generated by said tuner controller.

7. The combination as claimed in claim 6 where said television receiver includes a Channel Up switch, said controller being responsive to successive actuation of said Channel Up switch for accessing said tuner memory and controlling the display of successive channels having a saved designation stored in said tuner memory.

8. The combination as claimed in claim 7 wherein said programming module includes means for alternately transmitting to said tuner controller through said first and second connectors, Skip signals and Channel Up signals, said tuner controller being responsive to a Skip signal and a Channel Up signal to storing in said tuner memory a skipped designation for one of said channels.

9. The combination as claimed in claim 8 wherein said controller includes a counter responsive to said Channel Up signals for successively addressing said tuner memory, said tuner controller being responsive to said counter for storing said skipped designations at addresses determined by said counter.

10. A method of restricting viewer access in a television receiver having a tuner memory, a plurality of viewer-actuated switches including an Enter switch, a Skip switch, digit switches and a Channel Up switch, a tuner controller responsive to said switches for storing programming data in said tuner memory and controlling a tuner in accordance with said programming data to display only certain ones of available channels, a first plurality of leads connected between said tuner controller and said switches for applying scanning signals to said switches, and a second plurality of leads connected between said switches and said tuner controller for sensing which of said switches may be actuated, said method comprising:
disconnecting said Entry, Skip and digit switches from said first and said second plurality of leads;
providing a hand-held programming module having therein means for storing tier data defining the numbers of channels which may be accessed for viewing, a plurality of programming switches, and means responsive to actuation of a tier selection switch for applying the tier data to said programming switches; and,
providing connector means separably connecting the hand-held module to the television receiver to thereby connect each of said programming switches between one of said first plurality of leads and one of said second plurality of leads.

* * * * *